United States Patent
Huang et al.

(10) Patent No.: US 10,546,849 B2
(45) Date of Patent: Jan. 28, 2020

(54) SEMICONDUCTOR STRUCTURE FOR ELECTROSTATIC DISCHARGE PROTECTION

(71) Applicant: UNITED MICROELECTRONICS CORP., Hsinchu (TW)

(72) Inventors: Chung-Yu Huang, Tainan (TW); Hou-Jen Chiu, Taichung (TW); Tien-Hao Tang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/247,134

(22) Filed: Aug. 25, 2016

(65) Prior Publication Data

US 2018/0012882 A1    Jan. 11, 2018

(30) Foreign Application Priority Data

Jul. 11, 2016    (CN) .......................... 2016 1 0541426

(51) Int. Cl.
| | |
|---|---|
| *H01L 27/02* | (2006.01) |
| *H01L 29/06* | (2006.01) |
| *H01L 29/08* | (2006.01) |
| *H01L 29/10* | (2006.01) |
| *H01L 29/78* | (2006.01) |

(52) U.S. Cl.
CPC ........ *H01L 27/0248* (2013.01); *H01L 27/027* (2013.01); *H01L 29/0619* (2013.01); *H01L 29/0653* (2013.01); *H01L 29/0847* (2013.01); *H01L 29/1083* (2013.01); *H01L 29/7835* (2013.01)

(58) Field of Classification Search
CPC ............. H01L 27/0248; H01L 29/7835; H01L 29/1083
See application file for complete search history.

(56) References Cited

U.S. PATENT DOCUMENTS

| | | | | |
|---|---|---|---|---|
| 5,742,084 A | * | 4/1998 | Yu ....................... | H01L 27/0251 257/356 |
| 7,176,539 B2 | * | 2/2007 | Chen ................... | H01L 27/0207 257/356 |

(Continued)

OTHER PUBLICATIONS

S. M. Sze and Kwok K. Ng, Physics of Semiconductor Devices, John Wiley & Sons, Inc., pp. 79-80.*

(Continued)

*Primary Examiner* — Cuong Q Nguyen
*Assistant Examiner* — Shih Tsun A Chou
(74) *Attorney, Agent, or Firm* — WPAT, PC

(57) ABSTRACT

A semiconductor structure for electrostatic discharge (ESD) protection is provided. The semiconductor structure includes a substrate, a first doped well, a source doped region, a drain doped region, and a gate structure. The first doped well is disposed in the substrate and has a first conductive type. The source doped region is disposed in the substrate and has a second conductive type opposite to the first conductive type. The drain doped region is disposed in the substrate and has the second conductive type. The gate structure is disposed on the substrate and between the source doped region and the drain doped region. The gate structure is separated from the source doped region.

18 Claims, 3 Drawing Sheets

(56) References Cited

U.S. PATENT DOCUMENTS

| | | | | |
|---|---|---|---|---|
| 7,179,691 | B1* | 2/2007 | Lee | H01L 27/0255 438/135 |
| 7,335,543 | B2* | 2/2008 | Chen | H01L 29/42368 257/E29.133 |
| 8,283,727 | B1* | 10/2012 | Walker | H01L 29/0649 257/355 |
| 8,643,111 | B1* | 2/2014 | Jou | H01L 27/0259 257/213 |
| 2002/0109190 | A1* | 8/2002 | Ker | H01L 29/7436 257/355 |
| 2004/0041167 | A1* | 3/2004 | Marr | G11C 17/16 257/131 |
| 2005/0133871 | A1* | 6/2005 | Ker | H01L 27/0266 257/355 |
| 2006/0006462 | A1* | 1/2006 | Chang | H01L 21/76229 257/341 |
| 2006/0145260 | A1* | 7/2006 | Kim | H01L 27/0262 257/355 |
| 2007/0241407 | A1* | 10/2007 | Kim | H01L 27/0266 257/371 |
| 2010/0032749 | A1* | 2/2010 | Shrivastava | H01L 21/26586 257/328 |
| 2010/0078724 | A1* | 4/2010 | Imoto | H01L 27/0248 257/355 |
| 2010/0148256 | A1* | 6/2010 | Chang | H01L 29/0878 257/343 |
| 2011/0156147 | A1* | 6/2011 | Lim | H01L 23/62 257/355 |
| 2011/0169093 | A1* | 7/2011 | Kim | H01L 29/861 257/361 |
| 2011/0260287 | A1* | 10/2011 | Lee | H01L 23/5256 257/529 |
| 2012/0193711 | A1* | 8/2012 | Asano | H01L 27/0262 257/343 |
| 2013/0207184 | A1* | 8/2013 | Chen | H01L 27/0251 257/339 |
| 2013/0234246 | A1* | 9/2013 | Yang | H01L 21/76224 257/335 |
| 2013/0277742 | A1* | 10/2013 | Lee | H01L 29/7816 257/343 |
| 2014/0145249 | A1* | 5/2014 | Tsai | H01L 29/7391 257/288 |
| 2014/0167105 | A1* | 6/2014 | Salcedo | H01L 27/0262 257/140 |
| 2014/0339635 | A1* | 11/2014 | Komatsu | H01L 29/0619 257/339 |
| 2015/0092307 | A1* | 4/2015 | Petruzzi | H02H 9/043 361/56 |
| 2015/0155273 | A1* | 6/2015 | Nakajima | H01L 29/41725 257/76 |
| 2015/0162440 | A1* | 6/2015 | Ikuta | H01L 29/7816 257/139 |
| 2015/0380546 | A1* | 12/2015 | Komatsu | H01L 27/088 257/337 |
| 2016/0043216 | A1* | 2/2016 | He | H01L 29/7816 257/328 |
| 2016/0260705 | A1* | 9/2016 | Ikimura | H01L 29/7835 |
| 2016/0284801 | A1* | 9/2016 | Mori | H01L 29/402 |
| 2016/0372593 | A1* | 12/2016 | Yoo | H01L 29/7816 |
| 2017/0062406 | A1* | 3/2017 | Ko | H01L 27/0248 |
| 2017/0323880 | A1* | 11/2017 | Tai | H01L 27/0277 |

OTHER PUBLICATIONS

Kun-Yu Tai et al., "Semiconductor Device for Electrostatic Discharge Protection," U.S. Appl. No. 15/188,962, filed Jun. 21, 2016.

* cited by examiner

SEMICONDUCTOR STRUCTURE FOR ELECTROSTATIC DISCHARGE PROTECTION

This application claims the benefit of People's Republic of China application Serial No. 201610541426.7, filed on Jul. 11, 2016, the subject matter of which is incorporated herein by reference.

BACKGROUND

Technical Field

The disclosure relates in general to a semiconductor structure, and more particularly to a semiconductor structure for electrostatic discharge (ESD) protection.

Description of the Related Art

Chips and/or integrated circuits (ICs) are the most essential hardware foundation of the modern information society. With the sizes of chips and/or integrated circuits continue to be shrunk, it has become standard processes to form the shallow junction depth and the thinner gate oxide, add the lightly doped drain (LDD), the shallow trench isolation (STI) and self-aligned silicide in the technique of the complementary metal oxide semiconductor (CMOS). However, the processes mentioned above may cause the products of chips and/or integrated circuits to suffer electrostatic discharge (ESD) more easily. Therefore, an electrostatic discharge protection device is designed to protect the chips and/or integrated circuits.

SUMMARY

The disclosure is directed to a semiconductor structure. By the structure design at the source side, the electrostatic discharge damage may be prevented, and the robustness of the semiconductor structure may be effectively enhanced. Additional mask is not required, such that the manufacturing cost of the semiconductor structure may be effectively controlled.

According to one embodiment of the disclosure, a semiconductor structure for electrostatic discharge (ESD) protection is provided. The semiconductor structure includes a substrate, a first doped well, a source doped region, a drain doped region, and a gate structure. The first doped well is disposed in the substrate and has a first conductive type. The source doped region is disposed in the substrate and has a second conductive type opposite to the first conductive type. The drain doped region is disposed in the substrate and has the second conductive type. The gate structure is disposed on the substrate and between the source doped region and the drain doped region. The gate structure is separated from the source doped region.

Figure 1A:
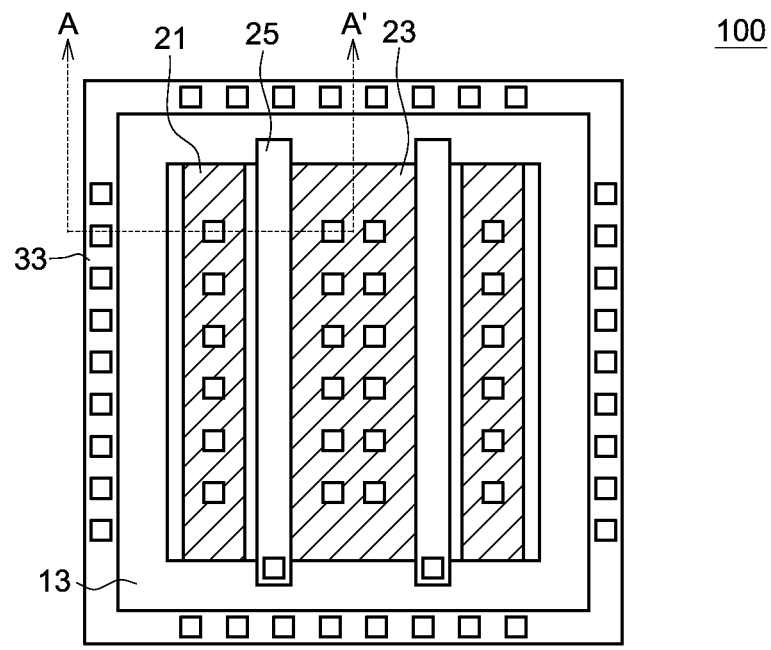
FIG. 1A illustrates a top view of the semiconductor structure 100 according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Figure 1B:
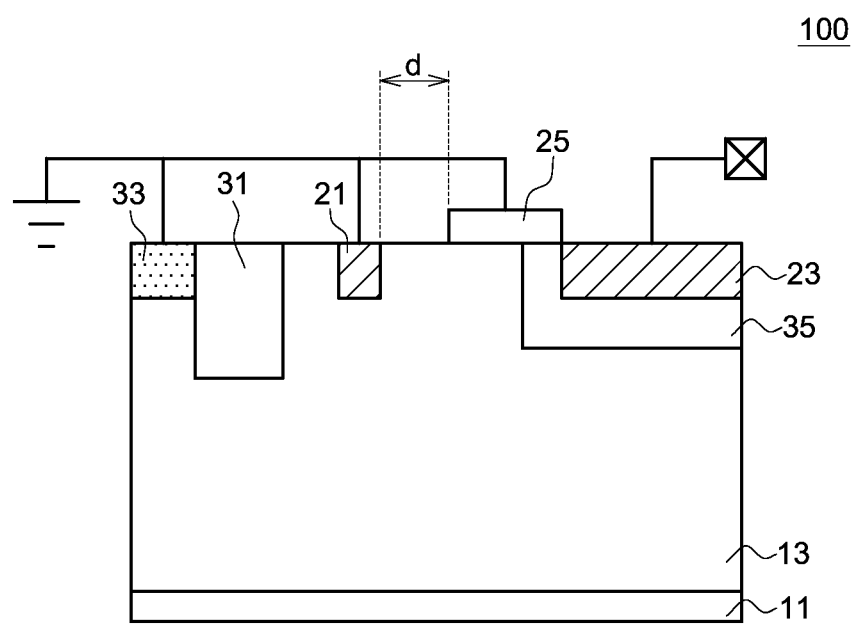
FIG. 1B illustrates a partial cross-section view of the semiconductor structure along line A-A' in FIG. 1A.

FIG. 1A illustrates a top view of the semiconductor structure 100 according to an embodiment of the disclosure. FIG. 1B illustrates a partial cross-section view of the semiconductor structure 100 along line A-A' in FIG. 1A. It should be noted that some elements are omitted to show the relationships between other elements in the semiconductor structure 100 more clearly.

As shown in FIG. 1A and FIG. 1B, the semiconductor structure 100 includes a substrate 11, a first doped well 13, a source doped region 21, a drain doped region 23 and a gate structure 25. The first doped well 13, the source doped region 21, the drain doped region 23 are disposed in the substrate 11, and the gate structure 25 is disposed on the substrate 11.

Further, the source doped region 21 and the drain doped region 23 are disposed in the first doped well 13, while the gate structure 25 is disposed on the first doped well 13 and between the source doped region 21 and the drain doped region 23.

In the embodiment of the disclosure, the gate structure 25 may be directly in contact with the drain doped region 23, but separated from the source doped region 21. That is, an interval may be between the gate structure 25 and the source doped region 21. In one embodiment, a distance d between the gate structure 25 and the source doped region 21 may be, for example, between 0.1 and 1 μm. However, the disclosure is not limited thereto.

In one embodiment, the first doped well 13 may be a high voltage (HV) well and have a first conductive type, such as P-type; the source doped region 21 and the drain doped region 23 may have a second conductive type opposite to the first conductive type, such as N-type.

Besides, the semiconductor structure 100 may further include a shallow trench isolation (STI) 31, a highly doped region 33 and a lightly doped drain (LDD) 35 disposed in the first doped well 13 as shown in FIG. 1B. For example, the highly doped region 33 may have the first conductive type, and a concentration of the highly doped region 33 is larger than a concentration of the first doped well 13. The lightly doped drain 35 may, for example, surround the drain doped region 23. The highly doped region 33 is separated from the source doped region 21 and the gate structure 25 by the shallow trench isolation 31 as shown in FIG. 1B. The highly doped region 33, the source doped region 21 and the gate structure 25 are electrically connected to a common ground at the same time as shown in FIG. 1B. The highly doped region 33 has a rectangular ring shape and surrounds outside of the source doped region 21 and the gate structure 25 as shown in FIG. 1A.

Generally, lower holding voltage ($V_h$) may cause better ESD robustness of an element. However, when the holding voltage ($V_h$) is smaller than the Supply Voltage (VDD) of the integrated circuit and the element is triggered by the external noise interference under normal operation, Latch-up effect may occur and damage the integrated circuit products.

Therefore, for effectively supplying suitable electrostatic discharge (ESD) protection to internal circuits and preventing Latch-up effect, the voltage-current of an ideal electrostatic discharge (ESD) protection element should be in the ideal ESD Protection Window.

Under high-voltage processes, because of higher VDD of the metal oxide semiconductor field effect transistor, it may be more difficult to make holding voltage ($V_h$) higher than VDD. Thus, it may be more difficult to prevent the high-voltage metal oxide semiconductor field effect transistor from Latch-up. Because of the semiconductor structure in the embodiment of the disclosure (i.e. the gate structure 25 is separated from the source doped region 21), the holding voltage ($V_h$) of the element may be enhanced under high-voltage processes, such that the ability of the high-voltage integrated circuit products to resist Latch-up effect may be enhanced.

It should be noted that the distance d between the gate structure 25 and the source doped region 21 mentioned in the embodiment above may be between 0.1 and 1 μm, however, since the distance d may directly affect the holding voltage ($V_h$), the distance d between the gate structure 25 and the source doped region 21 is not limited thereto. Further, the semiconductor structure in the embodiment of the disclosure is not limited to the structures shown in FIG. 1A and FIG. 1B.

Figure 2:
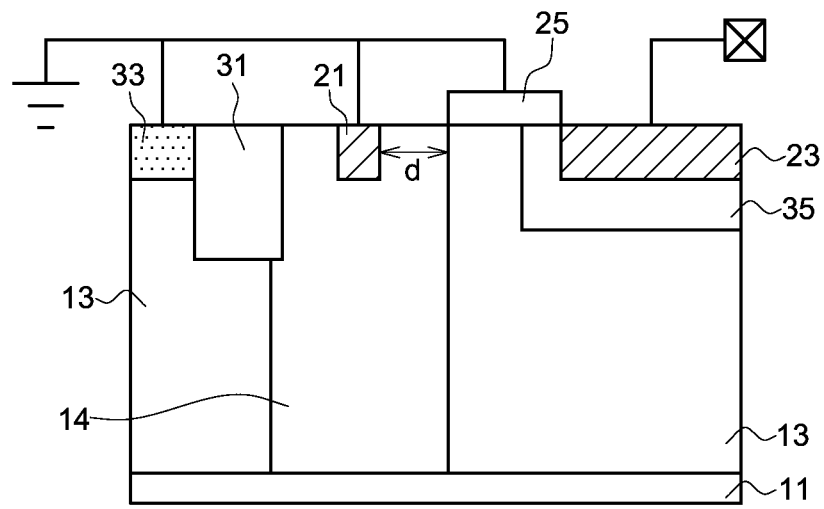
FIG. 2 illustrates a partial cross-section view of the semiconductor structure according to another embodiment of the disclosure.

FIG. 2 illustrates a partial cross-section view of the semiconductor structure 101 according to another embodiment of the disclosure. The top-view of the semiconductor structure 101 may be similar to the top-view of the semiconductor structure 100 as shown in FIG. 1A. Further, the semiconductor structure 101 has some elements similar to the elements of the semiconductor structure 100 as shown in FIGS. 1A and 1B. These elements will be indicated using the same designations.

Similarly, the semiconductor structure 101 includes a substrate 11, a first doped well 13, a source doped region 21, a drain doped region 23 and a gate structure 25. The first doped well 13, the source doped region 21, the drain doped region 23 are disposed in the substrate 11, and the gate structure 25 is disposed on the substrate 11.

Further, the source doped region 21 and the drain doped region 23 are disposed in the first doped well 13, while the gate structure 25 is disposed on the first doped well 13 and between the source doped region 21 and the drain doped region 23.

As shown in FIG. 2, the semiconductor structure 101 may further include a second doped well 14 disposed in the substrate 11. Further, at least portions of the second doped well 14 may be disposed between the source doped region 21 and the gate structure 25. That is, the gate structure 25 may be separated from the source doped region 21 by the second doped well 14.

In this embodiment, the source doped region 21 and the drain doped region 23 may have a second conductive type, such as N-type. Further, the second doped well 14 may also have the second conductive type, and a concentration of the second doped well 14 is smaller than a concentration of the source doped region 21. That is, the second doped well 14 may be a lightly doped HV N-well, but the disclosure is not limited thereto.

As shown in FIG. 2, the second doped well 14 may surround the source doped region 21. It should be noted that the position of the second doped well 14 is not limited to the position shown in FIG. 2. In some embodiments, the second doped well 14 may also disposed between the source doped region 21 and the gate structure 25 merely, not surround the source doped region 21.

Further, the distance d between the gate structure 25 and the source doped region 21 may be adjusted depending on design requirements. TABLE 1 shows the trigger voltage ($V_{t1}$) and the holding voltage ($V_h$) of the semiconductor structure 101 with different distances d. It should be noted that when the distance d between the gate structure 25 and the source doped region 21 equals to 0, such structure may be regarded as a comparison structure of the semiconductor structure 101.

TABLE 1

| d (μm) | $V_{t1}$ (V) | $V_h$ (V) |
|--------|--------------|-----------|
| 0.955  | 13           | 9.8       |
| 0.895  | 13           | 9.7       |
| 0.795  | 13           | 9.5       |
| 0      | 13           | 7.7       |

As the results shown in TABLE 1, when the distance d between the gate structure 25 and the source doped region 21 does not equal to 0, the holding voltage ($V_h$) of the semiconductor structure 101 is larger than the holding voltage ($V_h$) of the comparison structure (i.e. the distance d between the gate structure 25 and the source doped region 21 equals to 0).

Further, the holding voltage ($V_h$) of the semiconductor structure 101 increases following with the increase of the distance d between the gate structure 25 and the source doped region 21. However, the trigger voltage ($V_{t1}$) of the semiconductor structure 101 is almost unchanged. That is, the holding voltage ($V_h$) of the element may be enhanced because of the semiconductor structure in the embodiment of the disclosure (i.e. the gate structure 25 is separated from the source doped region 21), but other operation performances of the high-voltage integrated circuit products may not be influenced.

Figure 3:
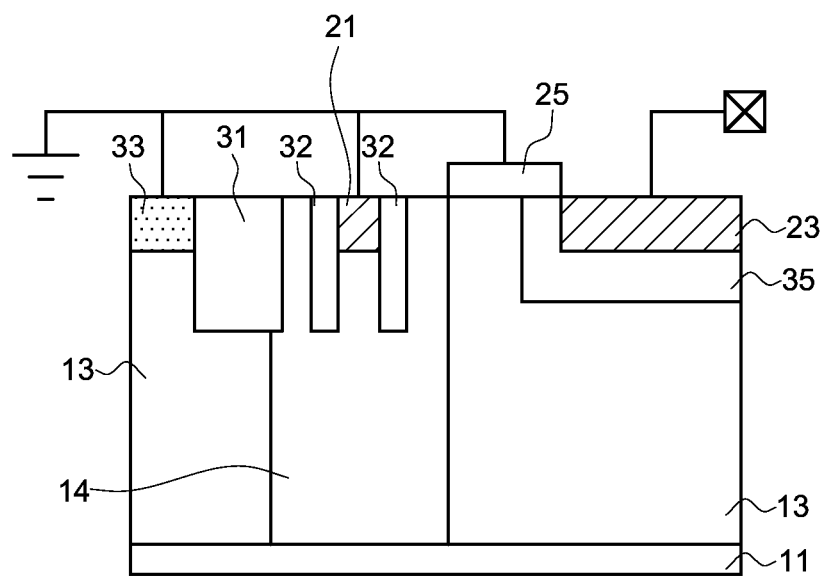
FIG. 3 illustrates a partial cross-section view of the semiconductor structure according to one embodiment of the disclosure.

FIG. 3 illustrates a partial cross-section view of the semiconductor structure 102 according to one embodiment of the disclosure. The top-view of the semiconductor structure 102 may be similar to the top-view of the semiconductor structure 100 as shown in FIG. 1A. Further, the semiconductor structure 102 has some elements similar to the elements of the semiconductor structure 101 as shown in FIG. 2. These similar elements will be indicated using the same designations and will not be narrated hereinafter.

As show in FIG. 3, the semiconductor structure 102 may further include a shallow trench isolation (STI) 32 disposed in the second doped well 14. In this embodiment, the shallow trench isolation 32 may be disposed on one side of the source doped region 21. As shown in FIG. 3, the shallow trench isolation 32 is disposed between the source doped region 21 and the gate structure 25.

Further, the shallow trench isolation 32 may also be disposed on another side of the source doped region 21. As shown in FIG. 3, the shallow trench isolation 32 is disposed between the source doped region 21 and the shallow trench isolation 31. That is, the shallow trench isolation 32 may be disposed on both sides of the source doped region 21.

Figure 4:
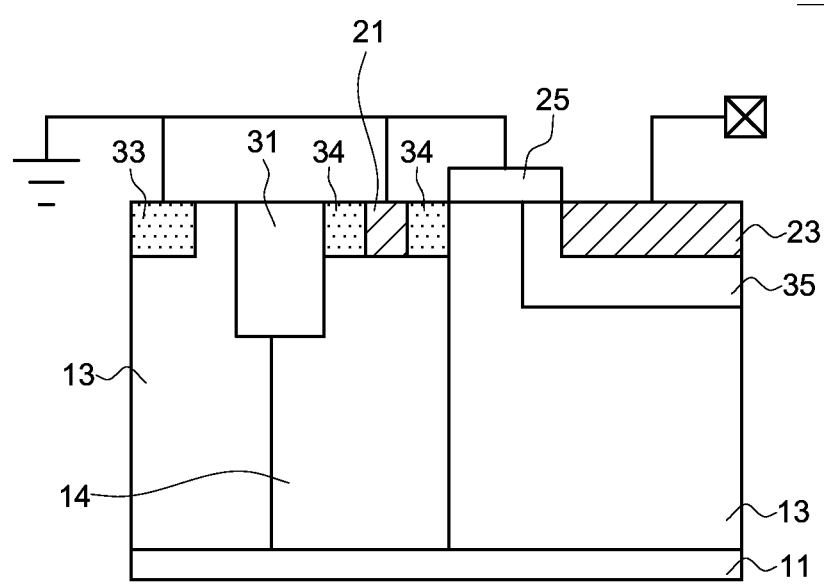
FIG. 4 illustrates a partial cross-section view of the semiconductor structure according to another embodiment of the disclosure.

FIG. 4 illustrates a partial cross-section view of the semiconductor structure 103 according to another embodiment of the disclosure. The top-view of the semiconductor structure 103 may be similar to the top-view of the semiconductor structure 100 as shown in FIG. 1A. Further, the semiconductor structure 103 has some elements similar to the elements of the semiconductor structure 101 as shown in FIG. 2. These similar elements will be indicated using the same designations and will not be narrated hereinafter.

As shown in FIG. 4, the semiconductor structure 103 may further include a first doped region 34 disposed in the second doped well 14. In this embodiment, first doped region 34 may be disposed on one side of the source doped region 21. As shown in FIG. 4, the first doped region 34 is disposed between the source doped region 21 and the gate structure 25.

Further, the first doped region 34 may also be disposed on another side of the source doped region 21. As shown in FIG. 4, the first doped region 34 is disposed between the source doped region 21 and the shallow trench isolation 31. That is, the first doped region 34 may be disposed on both sides of the source doped region 21.

In one embodiment, the first doped region 34 may have a first conductive type, such as P-type. Besides, a concentration of the first doped region 34 may be larger than a concentration of the first doped well 13. That is, the first doped region 34 may be, for example, a P-type heavily doped region. In another embodiment, the first doped region 34 may also be a lightly doped region.

Although the semiconductor structures 101, 102 and 103 shown in FIG. 2 to FIG. 4 all include the second doped well 14, the disclosure is not limited thereto.

Figure 5:
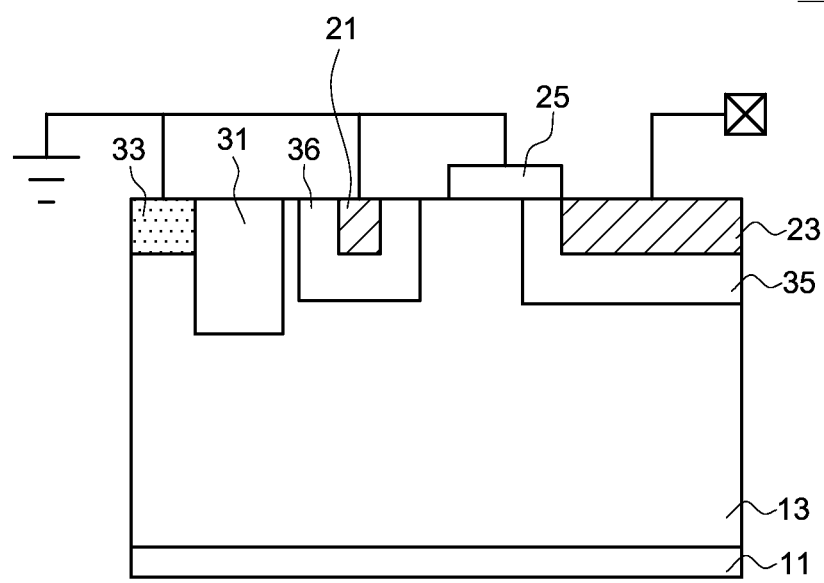
FIG. 5 illustrates a partial cross-section view of the semiconductor structure according to still another embodiment of the disclosure.

FIG. 5 illustrates a partial cross-section view of the semiconductor structure 104 according to still another embodiment of the disclosure. Similarly, the top-view of the semiconductor structure 104 may be similar to the top-view of the semiconductor structure 100 as shown in FIG. 1A. Further, the semiconductor structure 104 has some elements similar to the elements of the semiconductor structure 100 as shown in FIG. 1A and FIG. 1B. These similar elements will be indicated using the same designations.

As shown in FIG. 5, the semiconductor structure 104 further includes a light doped region 36 disposed in the first doped well 13. In this embodiment, the light doped region 36 surrounds the source doped region 21, and the light doped region 36 may be such as a lightly doped drain (LDD).

According to the embodiments above, the semiconductor structure for electrostatic discharge (ESD) protection of the disclosure may enhance the holding voltage ($V_h$) of the element under high-voltage processes by the design of separating the gate structure and the source doped region, such that the ability of the high-voltage integrated circuit products to resist Latch-up effect may be enhanced. Furthermore, the electrostatic discharge damage may be prevented, and the robustness of the semiconductor structure may be effectively enhanced. Additional mask is not required, such that the manufacturing cost of the semiconductor structure may be effectively controlled.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure for electrostatic discharge protection, comprising:
   a substrate;
   a first doped well disposed in the substrate and having a first conductive type;
   a highly doped region having the first conductive type and having a concentration larger than a concentration of the first doped well, wherein the highly doped region is formed in the substrate;
   a source doped region disposed in the substrate and having a second conductive type opposite to the first conductive type;
   a drain doped region disposed in the substrate and having the second conductive type;
   a common ground; and
   a gate structure disposed on the substrate and between the source doped region and the drain doped region, wherein all of the highly doped region, the source doped region and the gate structure are electrically connected to the common ground at same time, and the gate structure is separated from the source doped region.

2. The semiconductor structure according to claim 1, further comprising a second doped well, wherein at least portions of the second doped well are disposed between the source doped region and the gate structure.

3. The semiconductor structure according to claim 2, wherein the second doped well has the second conductive type, and a concentration of the second doped well is smaller than a concentration of the source doped region.

4. The semiconductor structure according to claim 2, wherein the second doped well surrounds the source doped region.

5. The semiconductor structure according to claim 2, further comprising:
   a first doped region disposed in the second doped well;
   wherein the first doped region has the first conductive type.

6. The semiconductor structure according to claim 5, wherein a concentration of the first doped region is larger than a concentration of the first doped well.

7. The semiconductor structure according to claim 5, wherein the first doped region is disposed between the source doped region and the gate structure.

8. The semiconductor structure according to claim 2, further comprising:
   a shallow trench isolation disposed in the second doped well;
   wherein the shallow trench isolation is disposed between the source doped region and the gate structure.

9. The semiconductor structure according to claim 1, further comprising:

a doped drain region surrounding the source doped region.

10. The semiconductor structure according to claim 1, further comprising a shallow trench isolation disposed between the source doped region and the gate structure, but not disposed between the drain doped region and the gate structure.

11. The semiconductor structure according to claim 1, further comprising a first doped region, wherein an interface between a sidewall of the first doped region and a sidewall of the source doped region has a PN junction.

12. The semiconductor structure according to claim 1, further comprising a shallow trench isolation, wherein the highly doped region is separated from the source doped region and the gate structure by the shallow trench isolation.

13. The semiconductor structure according to claim 1, wherein the highly doped region surrounds outside of the source doped region and the gate structure in a top view of the substrate.

14. The semiconductor structure according to claim 1, wherein the gate structure is directly in contact with the drain doped region.

15. The semiconductor structure according to claim 1, wherein the drain doped region is disposed above the first doped well.

16. The semiconductor structure according to claim 1, further comprising a doped drain region surrounding the drain doped region and partially under the gate structure.

17. The semiconductor structure according to claim 1, wherein the highly doped region has a rectangular ring shape in a top view of the substrate.

18. The semiconductor structure according to claim 1, wherein a distance between the gate structure and the source doped region is between 0.1 and 1 μm.

* * * * *